(12) United States Patent
Chen et al.

(10) Patent No.: US 8,215,510 B2
(45) Date of Patent: Jul. 10, 2012

(54) PHOTOMASK STORAGE APPARATUS

(75) Inventors: Hsin-Yuan Chen, Tainan (TW);
Chih-Fu Li, Pingtung (TW);
Chi-Chung Hsu, Tainan (TW);
Hsing-Fu Lee, Sanchong (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1143 days.

(21) Appl. No.: 12/053,859

(22) Filed: Mar. 24, 2008

(65) Prior Publication Data

US 2009/0239010 A1  Sep. 24, 2009

(51) Int. Cl.
*B65D 85/30* (2006.01)
*B65D 51/16* (2006.01)
(52) U.S. Cl. ...... 220/4.21; 206/455; 220/371; 220/367.1
(58) Field of Classification Search ............ 220/371, 220/367.1, 4.21; 206/454, 455
See application file for complete search history.

(56) References Cited

U.S. PATENT DOCUMENTS

| 5,995,200 | A | 11/1999 | Pierrat | |
|---|---|---|---|---|
| 6,216,873 | B1 * | 4/2001 | Fosnight et al. | 206/710 |
| 6,247,599 | B1 | 6/2001 | Cheng et al. | |
| 7,455,180 | B2 * | 11/2008 | Sumi et al. | 206/710 |
| 7,830,497 | B2 * | 11/2010 | del Puerto et al. | 355/77 |
| 7,950,524 | B2 * | 5/2011 | Lin et al. | 206/711 |
| 2003/0047562 | A1 * | 3/2003 | Wu et al. | 220/300 |
| 2005/0117142 | A1 * | 6/2005 | Heerens et al. | 355/75 |
| 2006/0260978 | A1 * | 11/2006 | Gregerson et al. | 206/710 |
| 2007/0002516 | A1 * | 1/2007 | Matsumoto | 361/234 |
| 2008/0149528 | A1 * | 6/2008 | Sumi et al. | 206/710 |
| 2008/0251414 | A1 * | 10/2008 | Lu | 206/710 |
| 2009/0035497 | A1 * | 2/2009 | Morikawa et al. | 428/34.5 |
| 2009/0127159 | A1 * | 5/2009 | Wang | 206/701 |
| 2010/0025277 | A1 * | 2/2010 | Iwaki et al. | 206/455 |

FOREIGN PATENT DOCUMENTS

CN  1983035  6/2007

OTHER PUBLICATIONS

Chinese Patent Office, Office action dated Jul. 8, 2010, Application No. 200810130539.3, 6 pages.

* cited by examiner

*Primary Examiner* — Mickey Yu
*Assistant Examiner* — Niki Eloshway
(74) *Attorney, Agent, or Firm* — Haynes and Boone, LLP

(57) ABSTRACT

A photomask storage apparatus including a bottom plate and top lid is provided. The photomask storage apparatus includes poly-ether ketone (PEEK). A fastening element is configured to couple the lid to the bottom plate. A retaining element is secured to the lid to prevent vibrations of a photomask. A vent structure is also provided. The vent structure is configured such that airflow through the vent is purged in approximately 360 degrees into a chamber including the photomask. The vent structure may include a particulate filter. A seal liner is disposed on the bottom component.

14 Claims, 8 Drawing Sheets

PHOTOMASK STORAGE APPARATUS

BACKGROUND

This disclosure relates generally to a storage and/or transport apparatus, and more particularly to a storage and/or transport apparatus for photomasks.

Photomasks are used during the photolithography process to pattern a substrate to form features of an integrated circuit. A photomask typically includes a transparent substrate having a patterned form thereon, through which radiation is passed in order to provide a pattern on a substrate (e.g., semiconductor wafer). A photomask must typically be stored, transported, and otherwise handled during its use during manufacturing processes. Inadequate storage and transportation can lead to photomask damage such as, from mishandling, dust or contamination, edge abrasion, and/or other defect sources. Furthermore, typical containers for photomasks are cumbersome to fabricate, clean, and use because, for example, of the quantity of components included the container. The high number of components introduces further risks such as loss of a component during use of the container which may slow production cycle times.

Furthermore, as reticle line widths decrease and resolution enhancement techniques (RET) increase in complexity in integrated circuit manufacturing processes, defects included in the photomask, including contamination, are even more likely to cause issues in the manufacturing process such as, yield loss, decreases in cycle time, and/or quality and reliability concerns.

Therefore, an improved apparatus for the storage and/or transport of a photomask is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
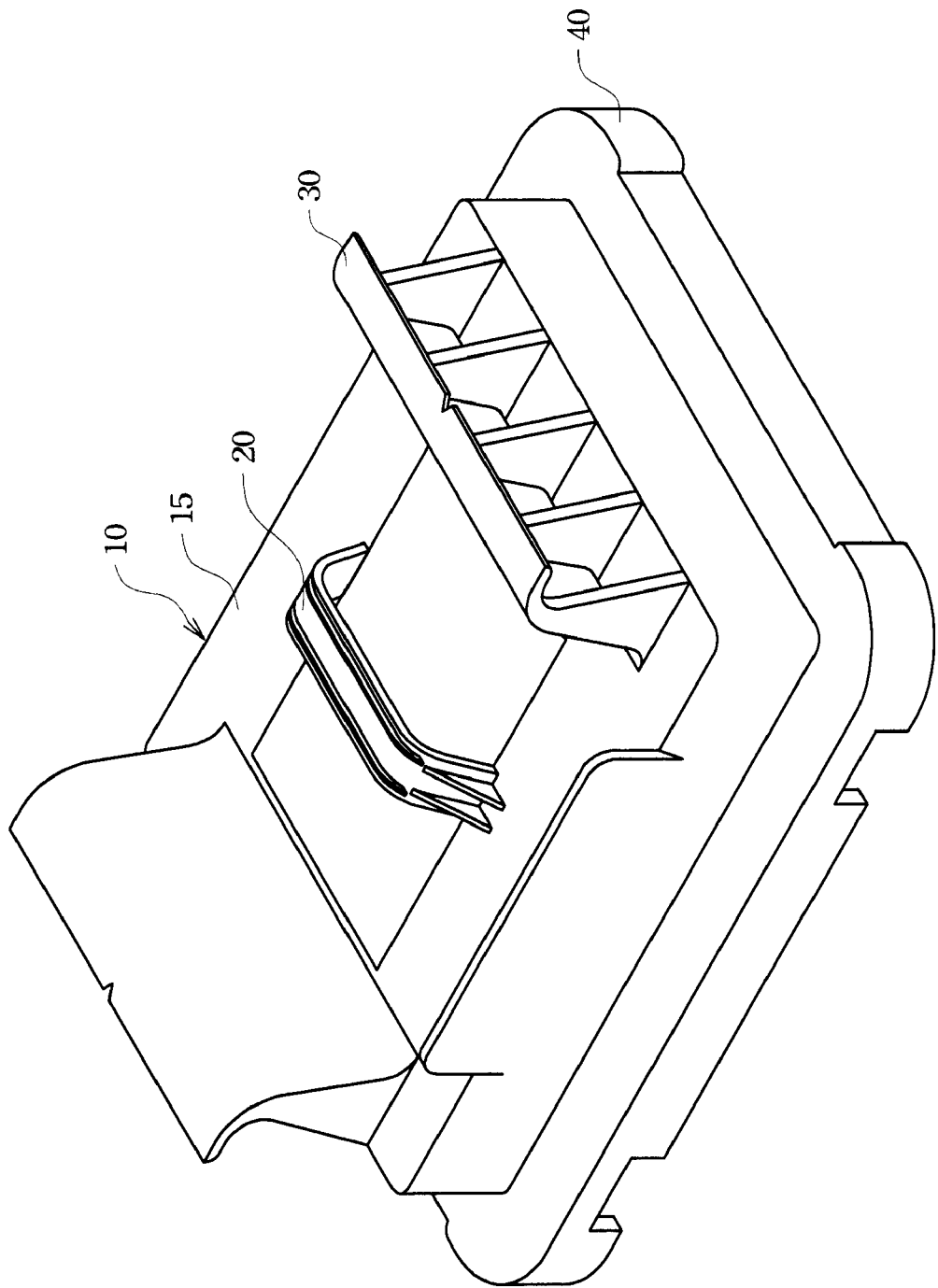
FIG. 1 is a perspective view illustrating an embodiment of a top component of a photomask storage apparatus.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Additionally, descriptive terms such as upper/lower, top/bottom, and vertical/horizontal are used for ease of description and provide relative relationship, but do not provide any limitation to an absolute direction.

Embodiments of a mask storage apparatus are described herein. A mask storage apparatus (device) may be a container or holder suitable for storage and/or transport of a photomask. The mask storage apparatus may be useful for transport, storage, and/or protection of a photomask during, after, and between uses in a fabrication process. For example, the storage apparatus may provide for protection from contamination, dust, manual handling, friction with other surfaces, and/or various other sources of damage. The mask storage apparatus described herein may provide storage and/or transport for one photomask or a plurality of photomasks.

A photomask may include a mask or reticle used in a photolithography process. A photomask includes a substrate which may be a transparent substrate such as fused silica ($SiO_2$), or quartz (relatively free of defects), calcium fluoride, or other suitable material. The photomask may include a binary mask, chrome-less phase shift mask (PSM), attenuated PSM (Att PSM), alternating PSM (ALT PSM), and/or other photomask technologies. In certain embodiments, attenuating material is disposed on the substrate and may include chrome or other materials such as, for example, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination thereof. The photomask may be used in a semiconductor manufacturing process by providing an integrated circuit pattern, a tft-lcd manufacturing process, and/or other processes known in the art employing photolithography.

Figure 2:
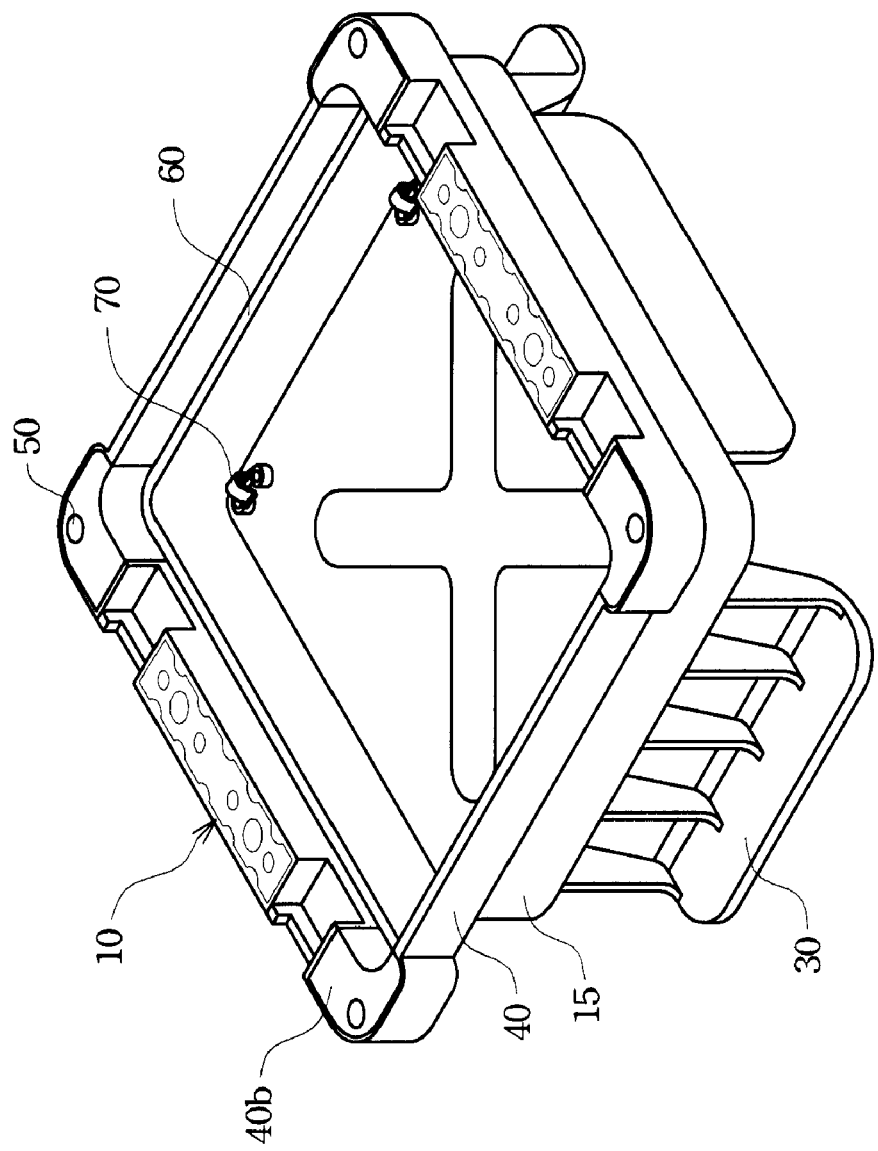
FIG. 2 is a perspective view illustrating an embodiment of the top component of the photomask storage apparatus of FIG. 1, illustrating the bottom of the component.

Referring now to FIGS. 1 and 2, illustrated is a top component 10 of a mask storage apparatus. The top component 10 may be a lid or cover of a mask storage apparatus. The top component 10 may be coupled with a second, bottom component (such as a bottom component 300, described below with reference to FIGS. 3 and 4) to provide a photomask storage cavity created and defined by the top component 10 and the bottom component. A photomask may be contained in the photomask storage cavity. The top component 10 includes a frame 15, a handle 20, and a stacking protrusion 30. The handle 20 and the stacking protrusion 30 may provide for transport of the mask storage apparatus and/or means for positioning the top component 10 on a bottom component of a mask storage apparatus, such as illustrated and described with reference to FIG. 9. In an embodiment, the stacking protrusion 30 provides support for auto transporting by an Auto Material Handling System (AMHS) and/or stacking a plurality of mask storage apparatus. The frame 15 includes an edge member 40. One or more surfaces of the edge member 40 may couple to a bottom component of the mask storage apparatus, for example, to the bottom component 300. In an embodiment, the frame 15 is molded (e.g., by injection molding) as a single component. In an embodiment, the frame 15 and the stacking protrusion 30 are molded (e.g., by injection molding) as a single component.

The frame 15 (e.g., lateral panels, top panel, and/or the edge member 40) includes a thermoplastic polymer composition. The thermoplastic composition may include a polyketone. In an embodiment, the frame 15 includes poly-ether ether ketone (PEEK). A PEEK composition may provide high temperature resistance, resistance to abrasive wear (e.g., reduction of particles formed by abrasion or friction), resistance to corrosion, resistance to fire and smoke, resistance to hydrolysis, and/or resistance to other effects that may negatively affect the photomask. The frame 15 including a PEEK composition may also provide insulation, include a high strength to weight ratio, provide dimensional stability, and/or other advantages. The PEEK composition may include a high purity composition. A PEEK composition may further provide for lower chemical outgassing than conventionally used materials. For example, a component having a PEEK composition may provide outgassing of 2.15 µg/g while a conventional material (YM710 or PMMA) may provide 117 µg/g of outgassing. In an embodiment, the frame 15 including the lateral panels, the top panel, and the edge member 40 and the stacking protrusion 30 are a unitary PEEK structure. In an embodiment, the frame 15 or portion thereof is formed by injection molding of a PEEK material.

Affixed to the frame 15 is a metal liner 60 (or shield). The metal liner 60 may protect a photomask from electrostatic discharge (ESD) events. The metal liner 60 may include any metal, including alloys, and/or other suitable conductive materials. Though described herein as a metal liner, the liner may be of any material suitable to protect from ESD events such as, any conductive material. A retaining element 70 is coupled to the metal liner 60. One or more retaining elements 70 may be included in the top component 10. In an embodiment, a retaining element is positioned adjacent each of four corners of the frame 15. In an embodiment, four retaining elements 70 are positioned on the frame 15. The retaining element 70 may be coupled to the metal liner 60 and affixed to the top component 10 with any suitable attachment mechanism. In an embodiment, a rivet included in the retaining element 70 is used to couple the retaining element 70 to the metal liner 60 and then the metal liner 60 may be coupled to the frame 15 by four fastening elements 50 at each of four corners. The retaining element 70 may provide support for a photomask such as securing the photomask from movement. In particular, the retaining element 70 may provide damping of vibrations experienced by the photomask in the vertical plane (e.g., from vibrations in a plane extending from top to bottom). The retaining element 70 is described in further detail below with reference to FIG. 5.

A bottom surface 40b includes a fastening element 50. In an embodiment, the fastening element 50 includes a screw. In an embodiment, the fastening element 50 includes a screw and a washer. The washer and/or screw may be metal. The fastening element 50 may couple one or more components of the top component 10 such as, the metal liner 60 and the frame 15, and/or couple the top component 10 and a bottom component of the photomask storage apparatus. In an embodiment, the fastening element 50 includes a screw having a thread length (e.g., length of screw including threads) of greater than 5 mm. The fastening element 50 may include advantages of minimizing loose parts in the photomask storage apparatus. Loose parts may cause issues such as an interruption in the functioning of a fabrication tool, for example, a scanner, used during the manufacturing process. The location of the fastening element 50 on the top component 10 is exemplary only and other embodiments are possible. In addition, the top component 10 may include one fastening element 50 or any plurality of fastening elements 50.

Figure 3:
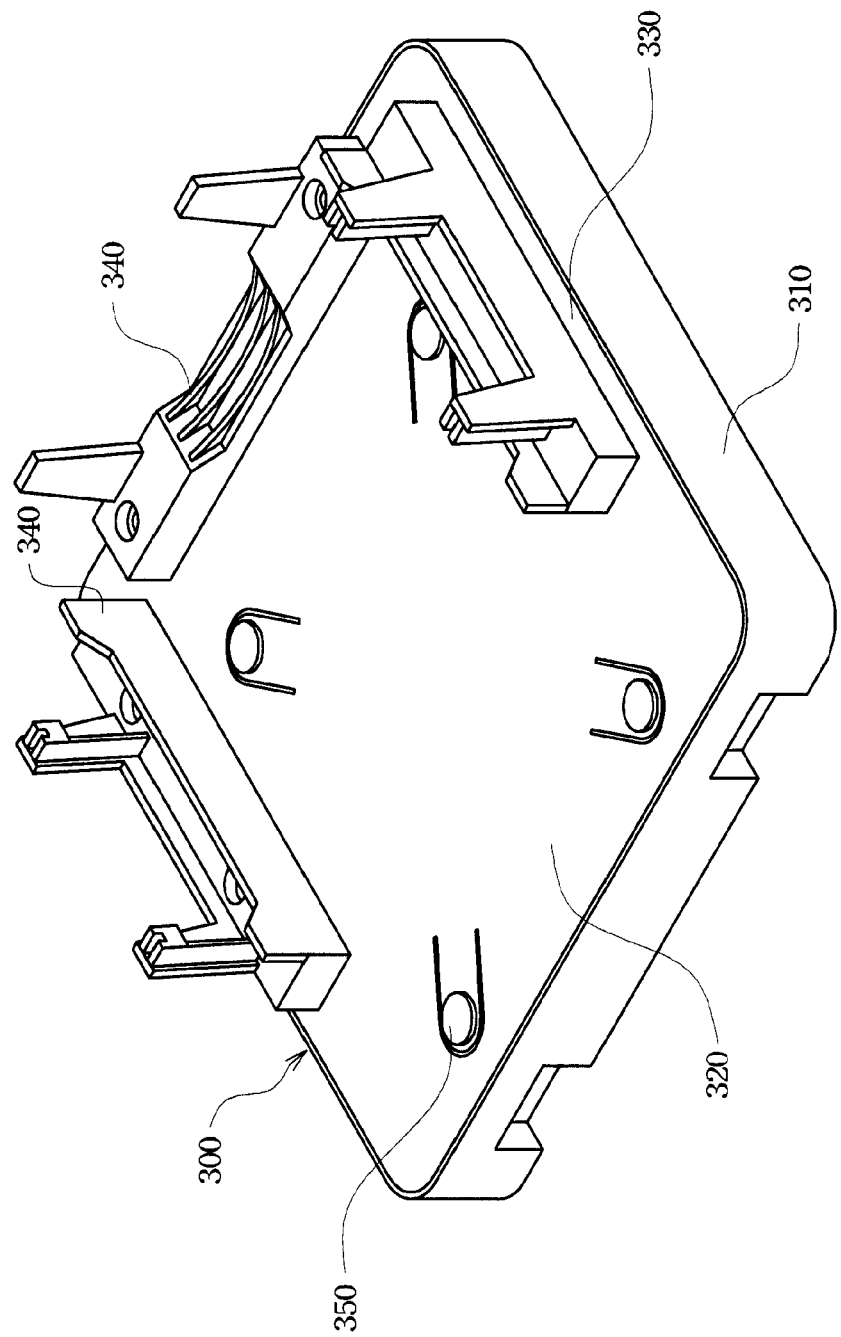
FIG. 3 is a perspective view illustrating an embodiment of a bottom component of a photomask storage apparatus.
Figure 4:
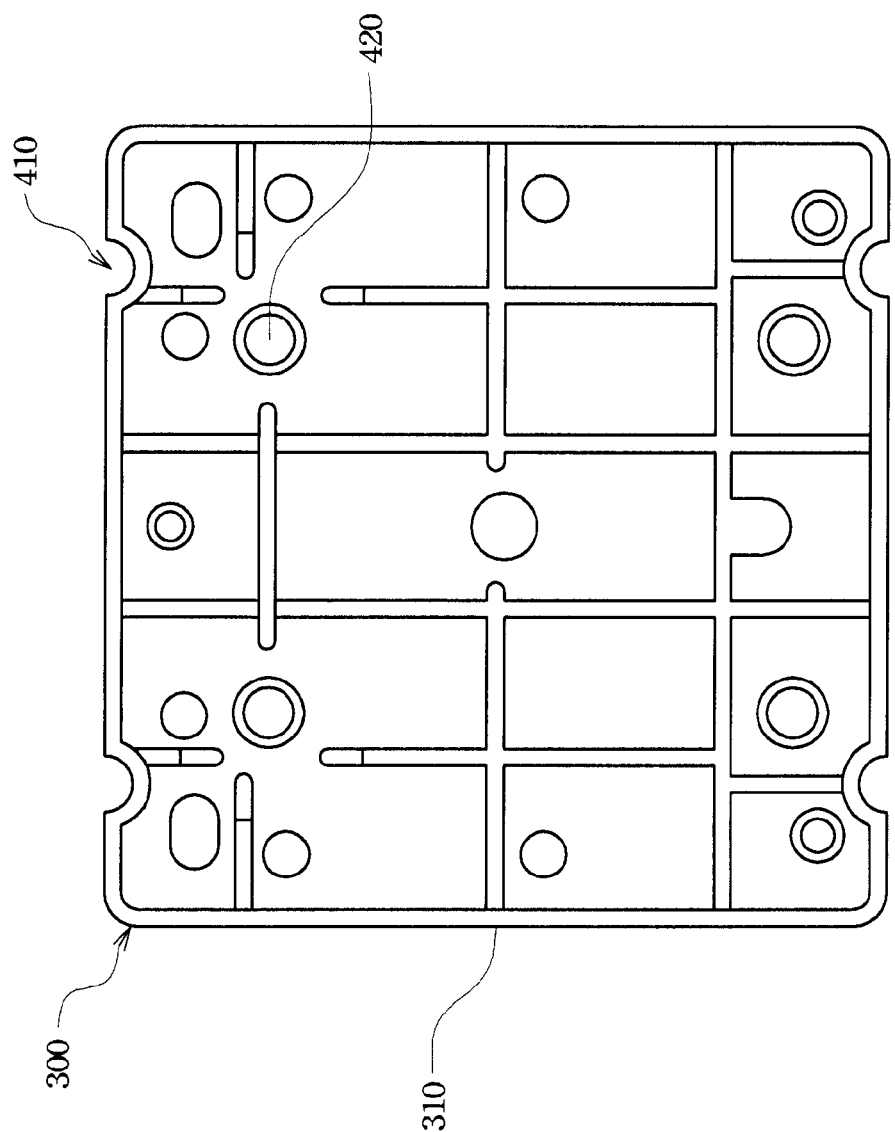
FIG. 4 is a bottom view illustrating an embodiment of a bottom component of a photomask storage apparatus.

Referring now to FIGS. 3 and 4, illustrated are perspective views of the bottom component 300 of a photomask storage apparatus. In an embodiment, the bottom component 300 may be used with the top component 10, described above with reference to FIGS. 1 and 2, to form a photomask storage apparatus. The top component 10 and the bottom component 300 may be coupled such that a photomask storage cavity is formed within which a photomask may be contained. The bottom component 300 includes a plate structure 310, a metal liner 320, a seal liner 330, a photomask support member 340, and a plurality of vent outlets 350. The plurality of vent outlets 350 are described in further detail with reference to FIGS. 6, 7, and 8. The quantity and positioning of the plurality of vent outlets 350 are exemplary only and not intended to be limiting in any manner. Including, for example, the vent outlets 350 may be positioned on another component of the photomask storage apparatus such as the top component 10, described above with reference to FIG. 1.

In an embodiment, the plate structure 310 includes PEEK. In an embodiment, the photomask support members 340 include PEEK. A PEEK composition may provide high temperature resistance, resistance to abrasive wear (e.g., reduction of particles formed by abrasion or friction), resistance to corrosion, resistance to fire and smoke, resistance to hydrolysis, and/or resistance to other environmental effects that may negatively affect the photomask. A PEEK composition may also provide insulation, a high strength to weight ratio, dimensional stability, a high purity composition, and/or other advantages. A PEEK composition may provide for lower chemical outgassing than conventionally used compositions.

Affixed to the plate structure is the metal liner 320. The metal liner 320 may protect a photomask from electrostatic discharge (ESD) events. The metal liner 320 may include any metal, including alloys, and/or other suitable conductive materials. The metal liner 320 may be substantially similar to the metal liner 60, described above with reference to FIG. 2.

In an embodiment, the photomask support members 340 include PEEK. The photomask support members 340 may be coupled to the metal liner 320 and/or the plate structure 310 through any suitable fastening means. The photomask support member 340 may provide support for a photomask to be stored and/or transported in the photomask storage apparatus including the bottom component 300. The photomask may be placed on the photomask support member 340 such that a surface and/or edge of the photomask is in direct contact with the photomask support. In an embodiment, the photomask support member 340 including PEEK may provide for lower outgassing and improved anti-friction properties as compared to a conventional material (e.g., YM710). The anti-friction properties may include advantages such as decreased friction between the photomask and the photomask support member 340 such that fewer particles are formed from the abrasion including fewer particulates originating from the photomask and/or the photomask support member 340.

In an embodiment, the seal liner 330 includes coated amorphous polyethylene terephthalate with conducting polymer, PEDT/PSSH. In an embodiment, the seal liner 330 includes approximately 99.5% amorphous polyethylene terephthalate and 0.5% PEDT/PSSH. The composition may be referred to as CS-105. The chemical and physical properties of the composition of the seal liner 330 may include a melting point of approximately 86 degrees Celsius, insolubility in water, a specific gravity of approximately 1.34 g/cm$^3$, odorless, clear, stable under ambient conditions, and/or be provided as a film. The material of the seal liner 330 may provide lower outgassing than conventional materials. For example, a seal liner 330 of CS-105 may provide an outgassing of approximately 6.58 μg/g, a conventional material, such as a sponge, may provide for an outgassing of approximately 640 μg/g.

Referring to FIG. 4 in particular, illustrated is a bottom side of an embodiment of the plate structure 310. The plate structure 310 includes the vent apertures 420 aligned with the vent outlets 350, described above with reference to FIG. 3. The location and/or quantity of the vent apertures 420 are for illustrative purposes only; the apertures 420 may be provided in a variety of configurations and quantities other than the embodiment illustrated. The plate structure 310 further includes a plurality of chamfered surface elements 410. The chamfered surface elements 410 may improve the seal performance of the photomask storage apparatus when a top component, such as the top component 10, described above with reference to FIGS. 1 and 2, is coupled to a bottom component including the plate structure 310.

Figure 5A:
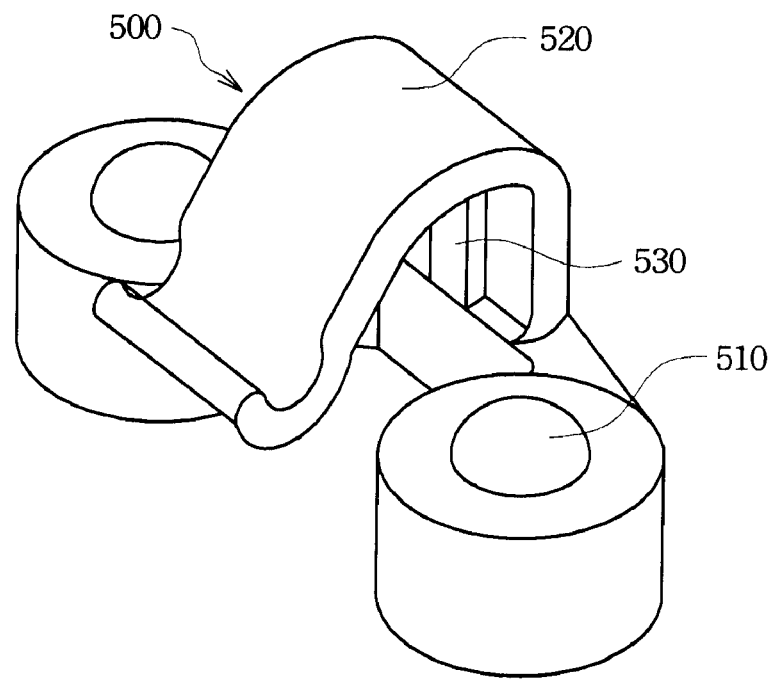
FIGS. 5a and 5b are perspective views illustrating an embodiment of a photomask retaining element of a photomask storage apparatus.
Figure 5B:
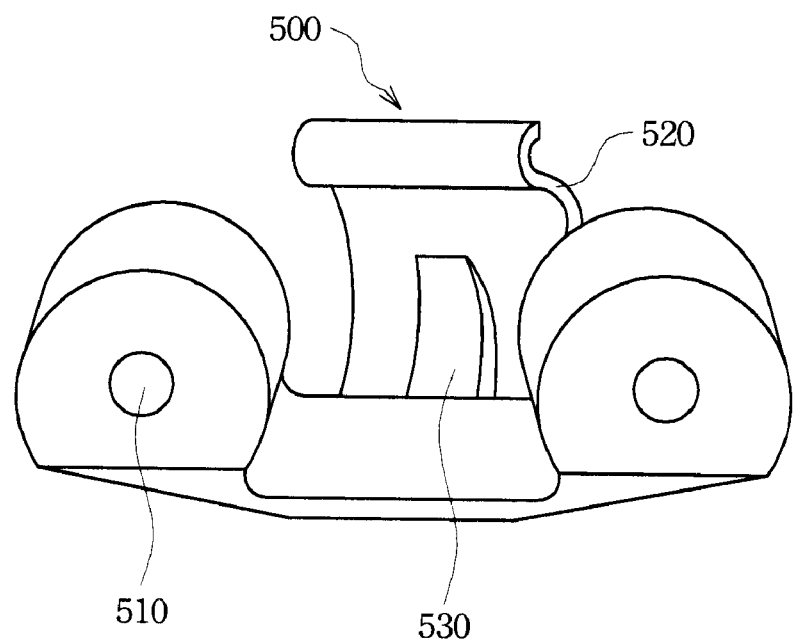

Referring now to FIGS. 5a and 5b, illustrated is an embodiment of a photomask retaining element 500. The photomask retaining element 500 may be included in a photomask storage apparatus such that movement (e.g., vibrations) experienced by the photomask in storage and transport is decreased. The photomask retaining element 500 may be substantially similar to the retaining element 70, described above with reference to FIG. 2, including for example, its placement on a top component of a photomask storage apparatus. The photomask retaining element 500 may be located on any portion of a photomask storage apparatus such that it may support a photomask (e.g., reduce vibrations experienced by the photomask) contained therein.

The photomask retaining element 500 may be affixed by rivets 510 to a component of the photomask storage apparatus. The photomask retaining element 500 may be coupled to the top component of a photomask storage apparatus, such as the metal liner 60, described above with reference to FIG. 2, using rivets. Other fastening means may be possible. In an embodiment, the photomask retaining element 500 is coupled, for example by rivets 510, to a metal liner of a top component, such as the metal liner 60, also described above with reference to FIG. 2. The photomask retaining element 500 includes a mask support element 520. The mask support element 520 may contact the photomask such as to dampen vibrations experienced by the photomask. Coupled to the mask support element 520 is a support rib 530. The support rib 530 may be of the same composition as the mask support element 520. In an embodiment, the support rib 530 and the mask support element 520 are unitary (e.g., one piece). In an embodiment, the support rib 530 and the mask support element 520 are co-molded. The support rib 530 may provide advantages such as increased strength of the photomask retaining element. By way of example, a pull test of a photomask retaining element may illustrate a photomask retaining element including a rib withstands 9.0 kg of force, and without the support rib withstands 4.6 kg. As such, the support rib 530 may prevent the photomask retaining element 500 from breaking under stress.

Figure 6:
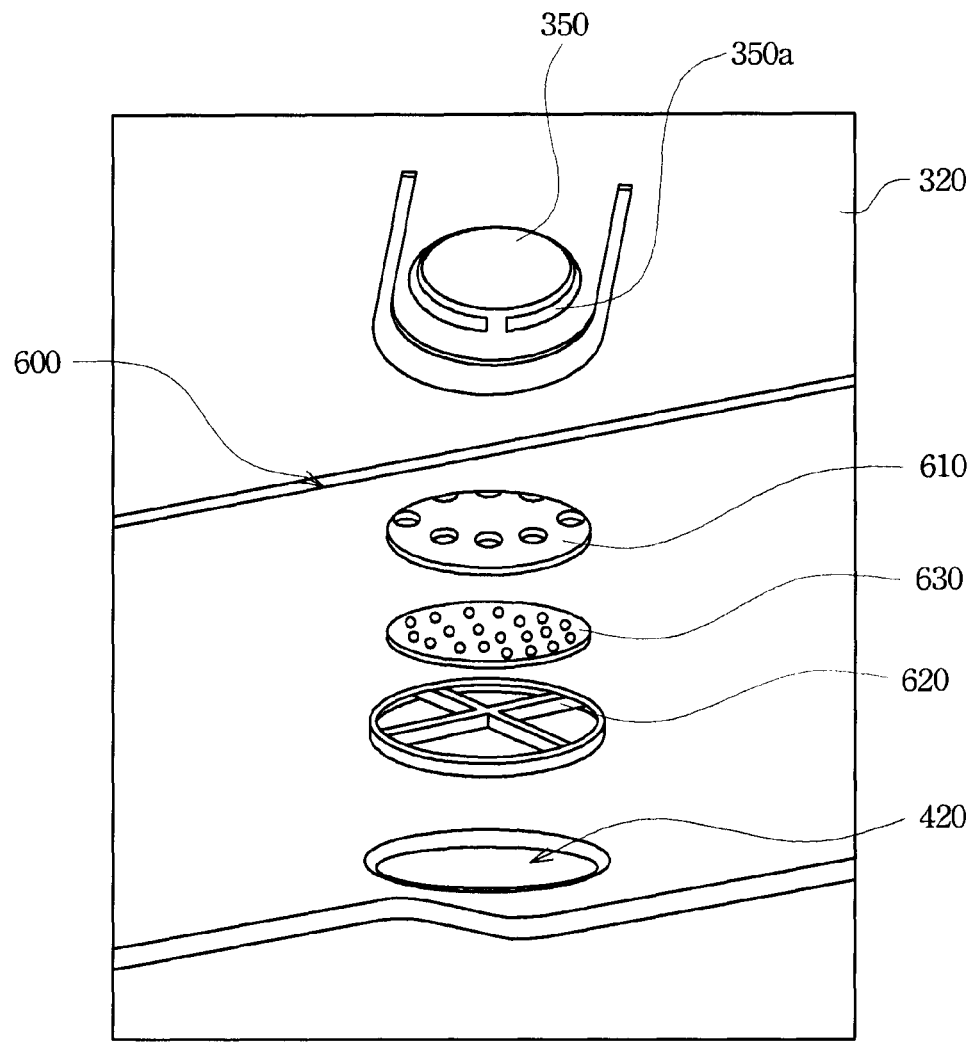
FIG. 6 is a perspective view illustrating an embodiment a conductive liner of a photomask storage apparatus including a vent.
Figure 7:
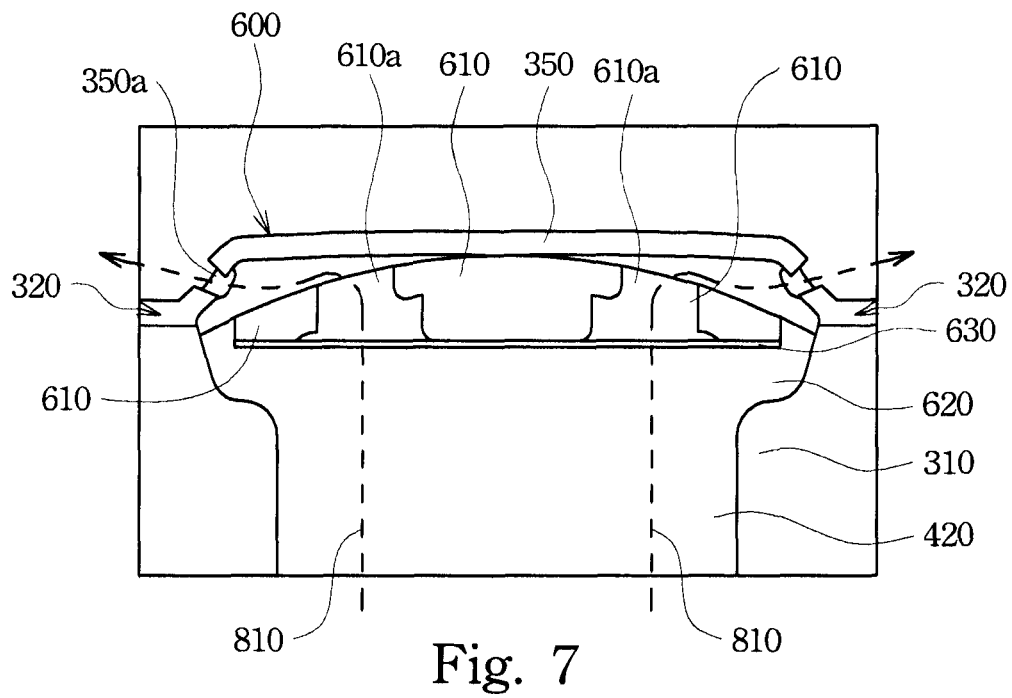
FIG. 7 is a cross-sectional view illustrating an embodiment of a vent of a photomask storage apparatus.
Figure 8:
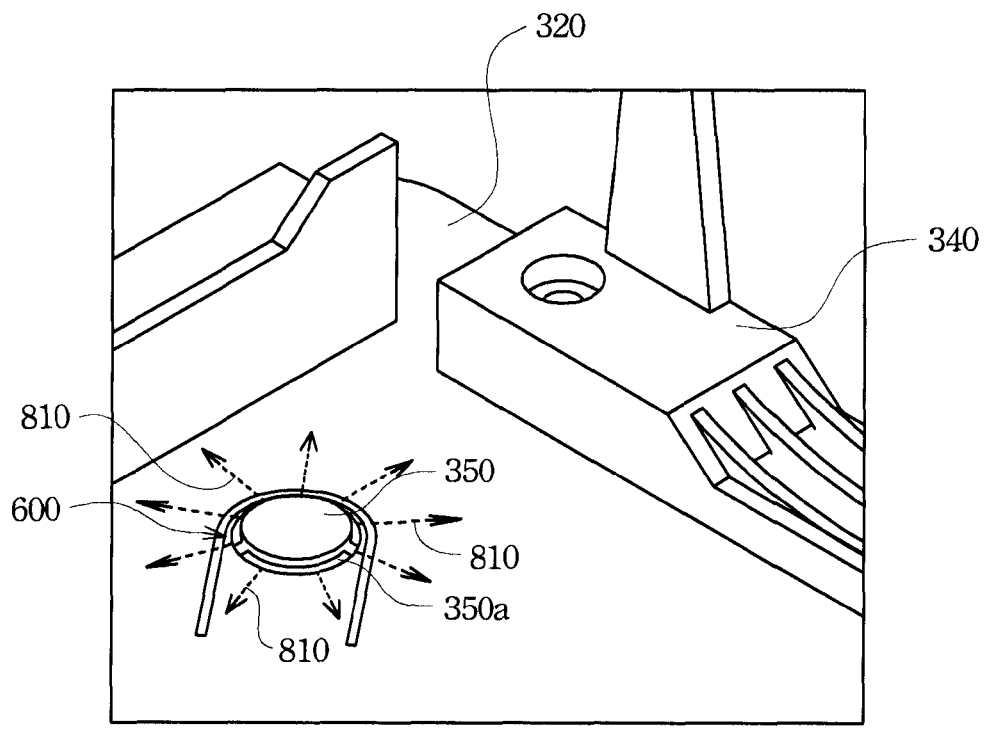
FIG. 8 is a perspective view illustrating an embodiment of a conductive liner of a photomask storage apparatus.

Referring now to FIGS. 6, 7, and 8, illustrated is an embodiment of a vent structure 600 configured for inclusion in a photomask storage apparatus. The vent structure 600 may be used to provide a gas (e.g., nitrogen, air including Clean and Dry air (CDA) or Extra Clean and Dry Air (XCDA), and/or other suitable substances) to the photomask storage apparatus. For example, the vent structure 600 may be used to provide a gas from a source external to the storage apparatus, through the vent structure 600 into a photomask storage cavity provided in the photomask storage apparatus such that the cavity may be purged. The gas purge may reduce contamination, remove particles having settled on the mask, and/or other possible benefits. In an embodiment, a nitrogen ($N_2$) purge is provided. The vent structure 600 includes the vent outlet 350 and the vent aperture 420 in the bottom plate 310, as described above with reference to FIGS. 3 and 4.

Positioned over the vent aperture 420 are a first and second encapsulating members 610 and 620, also referred to as support members or filter support members. In an embodiment, the encapsulating members 610 and 620 include PEEK. The encapsulating members 610 and 620 include a configuration of apertures, for example aperture 610a, such that a gas may pass through the encapsulating members. The configuration of apertures illustrated is exemplary only and not intended to be limiting in any manner. A particle filter 630 interposes the encapsulating members 610 and 620. The particle filter 630 may be operable to filter particles included in the gas supply such that they are excluded from entering the photomask storage cavity. The particle filter 630 may filter particles originating from outgassing of materials including those contained in the photomask storage apparatus, particles from the surrounding environment, particles generated by friction of one or more components of the photomask storage apparatus, particles introduced by the gas supply, and/or other particle sources.

The metal liner 320, in particular the vent outlet 350 of the metal liner 320, is disposed over the particle filter 630 and the encapsulating members 610 and 620. The metal liner 320 is substantially similar to as described above with reference to FIG. 3. The vent outlet 350 provides for approximately 360 degree gas flow by releasing the gas to the photomask cavity through apertures 350a. For example, in an embodiment, nitrogen is introduced through the vent aperture 420 in the bottom plate 310. The nitrogen flows through the particle filter 630, as well as the encapsulating members 610 and 620, and exits through the vent outlet 350, in particular through the apertures 350a of the vent outlet 350. In the embodiment, a stream of nitrogen is delivered (e.g., purged from the vent structure 600) to the photomask cavity in approximately 360 degree direction as illustrated by a gas flow 810. The release or purging of gas in directions encompassing approximately 360 degrees may be beneficial in providing improved gas purge efficiency of the photomask cavity. The efficiency may be increased due to the elimination of a "dead corner" or portion of a cavity to which a purge is not directed.

Figure 9A:
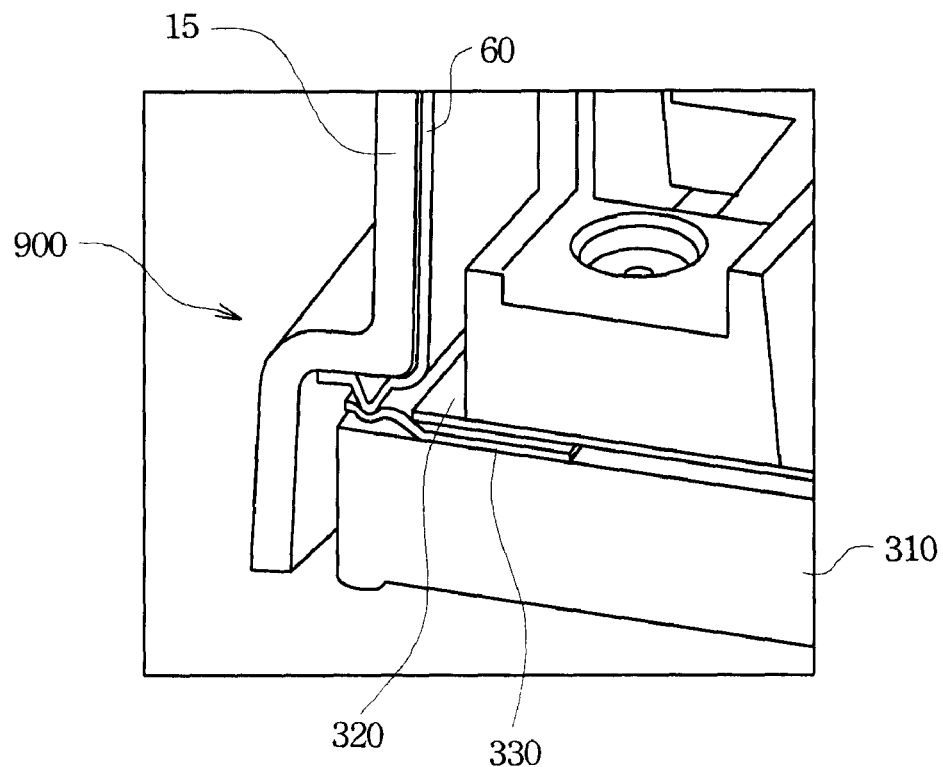
FIG. 9 is a perspective view of a cross section illustrating an embodiment of the coupling of a top component and a bottom component of a photomask storage apparatus.
Figure 9B:
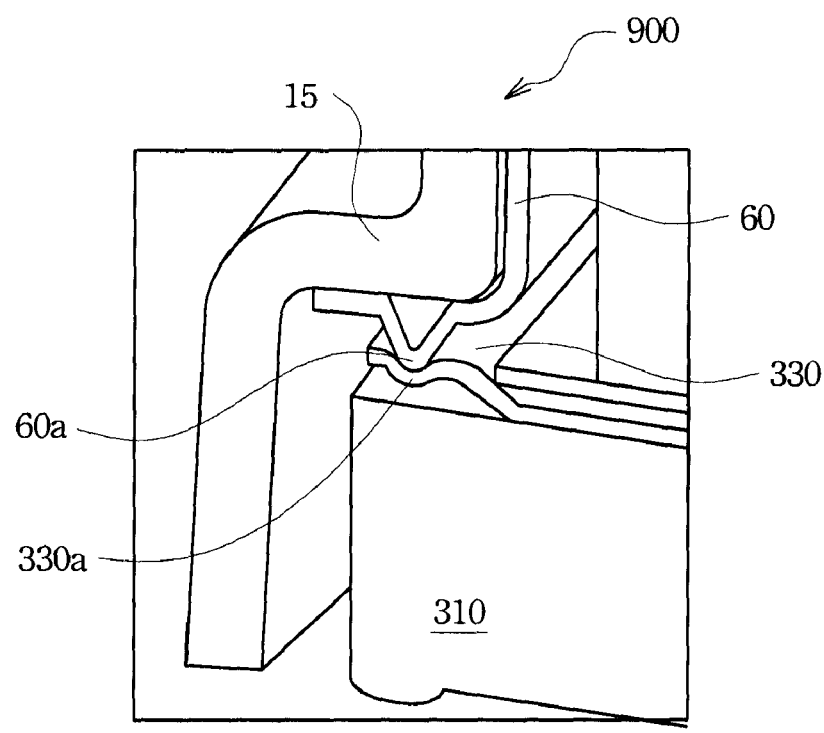

Referring now to FIG. 9, illustrated is an embodiment of the coupling surfaces of a top component and a bottom component of a photomask storage apparatus 900. The photomask storage apparatus 900 includes the frame 15 and the metal liner 60 of the top component 10, which are substantially similar to as discussed above with reference to FIGS. 1 and 2. The photomask storage apparatus 900 further includes the bottom plate 310, the metal liner 320, and the seal liner 330 of the bottom component 300, substantially similar to as described above with reference to FIGS. 3 and 4. A protrusion 60a is included in the metal liner 60. A channel 330a is included in the seal liner 330. The top component 10 and the bottom component 300 are coupled such that the protrusion 60a aligns with the channel 330a. Coupling the top component 10 and the bottom component 300 in this manner may prevent movement (e.g., slide) between the top component 10 and the bottom component 300.

Therefore provided for is an improved photomask storage apparatus. The photomask storage apparatus (e.g., container) may be useful for storage and/or transport of photomasks. In an embodiment, the photomask apparatus includes PEEK. For example, a top component (e.g., lid) and a bottom component (e.g., plate) may be fabricated of PEEK, as well as an interior mask support element. The top component and bottom component are coupled such that a cavity is formed where a photomask may be disposed. A fastening element (e.g., screw) may be configured to couple subcomponents of the top component (e.g., a frame and a metal liner), or couple a top and bottom component of the apparatus. In an embodiment, the fastening element includes a washer. A retainer member, or a plurality of such members, may be affixed to the lid of the photomask storage apparatus. The retainer member may be used to at least partially secure the photomask from vertical vibration or movement. A photomask may be disposed on a mask bottom support for transport and/or storage in the apparatus; the mask bottom support being affixed to the bottom plate. In an embodiment, the mask bottom support is PEEK.

One or more vents may also be included in the bottom component (e.g., plate). A particle filter may be disposed over the vent to filter an incoming gas supply. A bottom seal liner may be disposed on the bottom plate and provide a seal between the bottom plate and lid when coupled. In an embodiment, the bottom seal liner includes CS-105.

The improved photomask storage apparatus may provide benefits such as, lower chemical outgassing, antifriction properties, simplification of design, improved strength, improved gas purge flow, precipitate prevention, and/or particulate prevention. The use of PEEK material may provide for the photomask to experience a decreased exposure to particles (e.g., contamination). The high particle production rate of a conventional material (for example, a softer material as compared to PEEK) may cause high Integrated Reticle Inspection System (IRIS) failure rates and necessitate costly rework of a semiconductor wafer. Rework of a wafer may be required, for example, if a contaminate on the photomask obstructs alters the irradiation and distorts the pattern formed on the substrate (e.g., by forming a structure that may bridge two features on the wafer and cause a short). An IRIS tool functions as a mask surface inspection tool by providing a radiation beam directed onto the photomask (glass surface and pellicle face) and measurement of the reflected radiation beam provides the particle size. Increased strength of the photomask storage apparatus may have additional benefits such as, longer use lifetime of the apparatus.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. For example, though described herein as providing a photomask storage apparatus, the disclosure may also provide for a storage and/or transport apparatus for, for example, a substrate or semiconductor wafer.

What is claimed is:

1. An photomask storage apparatus, comprising:
   a top component and a bottom component including polyether ether ketone (PEEK);
   at least one retaining element coupled to the top component;
   a seal liner disposed on the bottom component, wherein the seal liner provides an interface between bottom component and the top component upon coupling the bottom and top components, wherein the seal liner includes a notch; and
   a metal liner disposed on the top component, and wherein the metal liner has a protrusion operable to mate with the notch of the seal liner when the top component and the bottom component are coupled.

2. The apparatus of claim 1, wherein the top component and the bottom component are lined with a conductive material.

3. The apparatus of claim 1, wherein the seal liner includes CS-105.

4. The apparatus of claim 1, further comprising:
   at least one vent structure in the bottom component, wherein the at least one vent structure is configured such that a gas supplied through the vent structure is purged in directions of approximately 360 degrees.

5. The apparatus of claim 4, wherein the at least one vent structure includes a particle filter.

6. The apparatus of claim 4, further comprising:
   an gas source operable to supply gas to and through the vent structure.

7. The apparatus of claim 6, wherein the gas is nitrogen or air.

8. The apparatus of claim 5, further comprising:
   a first filter support member and a second filter support member located adjacent the filter and disposed over a vent aperture of the vent structure, wherein the first and second support members include PEEK.

9. The apparatus of claim 1, further comprising:
   a fastening element including a screw and a washer, and wherein the screw includes a thread length of greater than 5 mm, and wherein the fastening element provides coupling to the top component.

10. The apparatus of claim 1, wherein the retaining element includes a support rib.

11. The apparatus of claim 1, further comprising:
    a mask support member disposed on the bottom component, wherein the mask support member includes PEEK.

12. The apparatus of claim 1, wherein the retaining element at least partially prevents a photomask from movement.

13. The apparatus of claim 1, wherein the at least one retaining element includes four retaining elements, one affixed adjacent to each corner of the top component.

14. The apparatus of claim 1, further comprising:
    means for providing a filtered stream of gas into a cavity between the top component and the bottom component, wherein the gas is provided in directions encompassing approximately 360 degrees.

* * * * *